United States Patent [19]

Heinen

[11] Patent Number: 4,806,765
[45] Date of Patent: Feb. 21, 1989

[54] METHOD AND APPARATUS FOR CHECKING THE SIGNAL PATH OF A MEASURING SYSTEM

[75] Inventor: Raymond Heinen, Cologne, Fed. Rep. of Germany

[73] Assignee: Leybold-Heraeus GmbH, Cologne, Fed. Rep. of Germany

[21] Appl. No.: 916,822

[22] Filed: Oct. 9, 1986

[30] Foreign Application Priority Data

Oct. 12, 1985 [EP] European Pat. Off. ........ 85112978.3

[51] Int. Cl.⁴ ...................... G01T 1/185; B01D 59/44
[52] U.S. Cl. ..................................... 250/389; 250/282
[58] Field of Search ............ 250/281, 282, 299, 252.1, 250/389; 340/635

[56] References Cited

U.S. PATENT DOCUMENTS 4,215,411 7/1980 Franzen .............................. 250/282
4,327,289 4/1982 Solomon ............................. 250/252
4,336,455 6/1982 Bryant ................................. 250/385
4,495,413 1/1985 Lerche et al. .................... 250/252.1
4,540,884 9/1985 Stafford et al. ...................... 250/282
4,665,315 3/1987 Bacchetti et al. ................ 250/492.1

Primary Examiner—Bruce C. Anderson
Assistant Examiner—Michael Aronoff
Attorney, Agent, or Firm—Felfe & Lynch

[57] ABSTRACT

The disclosure relates to a method and apparatus for checking the signal path in a measuring system of the type having a collector for charged particles and an amplifier connected to its output to form a voltage or current signal. To permit sensitivity tests with currents on the order of $10^{-12}$ A and less, it is proposed that a capacitive current, produced by means of a influencing electrode situated in the vicinity of the charge collector, be fed into the charge collector. An electrode already present in the measuring system can be used as the influencing electrode.

11 Claims, 2 Drawing Sheets

METHOD AND APPARATUS FOR CHECKING THE SIGNAL PATH OF A MEASURING SYSTEM

BACKGROUND OF THE INVENTION

The invention relates to a method for checking the signal path of a measuring system, of the type having a collector for charged particles and an amplifier connected to its output for the formation of a voltage or current signal, in which a known current is supplied to the charge collector. The present invention furthermore relates to an apparatus for practicing this method as well as to the application of this method in mass spectrometers, ionization vacuum meters and the like.

Measuring systems which have a charge collector and a measuring amplifier connected thereto, such as those used, for example, in mass spectrometers, ionization vacuum meters and the like, must normally be highly sensitive. This results from the need to record ever smaller particle currents impinging upon the charge collector. If, for example, it is desired to register a particle current of $10^{-16}$ A, which corresponds to a current of about 600 ions or electrons per second, then the resistance that serves to produce a voltage signal in the measuring amplifier must be extremely high. This high sensitivity of such systems requires that the charge collector as well as the first stage of the following amplifier be perfectly shielded. Consequently, this part of the system, which is important for the measurement signal, is usually quite inaccessible.

If it is desired to verify the operation of the signal path in the electronic circuits connected to the output of the charge collector, a known current must be fed into the charge collector. The introduction of a current in the range of $10^{-12}$ A and less, however, constitutes a source of error and inaccuracy, not only in the test, but also in the measuring operation itself. Consequently, sensitivity tests with currents of the above-stated order of magnitude have not been possible heretofore, since none of the former test methods could do without a galvanic connection to the input of the measurement amplifier.

The present invention is addressed to the problem of checking the electronic devices connected to the output of a charge collector, even in the case of very small measurement currents, without thereby negatively affecting the characteristics in the measurement operation itself.

SUMMARY OF THE INVENTION

In a method for checking the signal path in a measuring system of the kind described above, this problem is solved, according to the present invention, by feeding into the charge collector a capacitive coupled current produced by means of an influencing electrode situated in the vicinity of the charge collector. The influencing electrode in the vicinity of the charge collector has with respect to the latter a fixed, measurable and reproducible, constant coupling capacitance $C_K$. This being the case, it is possible, by a known voltage variation at the influencing electrode, to introduce a certain capacitive coupled current into the charge collector without a galvanic connection to it. Thus the disadvantages associated with such a connection are also eliminated, such as increase of the node-capacitance and the leakage currents, as well as the effects connected therewith, namely increase of the noise level and drift. By this method, the testing of the operation of the directly connected, electrometer amplifier can be performed very quickly, without the complexity involved in manipulations within the high-resistance area since, in the event of a known voltage change at the influencing electrode, a precisely predetermined signal will be produced at the output of the measuring amplifier. Quantification of the results of the measurement is likewise possible.

The influencing electrode can be a separate electrode which is connected during the test period to a voltage generator and is grounded during the measuring period. It is also possible, however, to use electrodes which are already present in the measuring system, such as deflecting or separating electrodes in a mass spectrometer or the anode of an ionization vacuum meter, as the influencing electrode during the test period. These electrodes have a well known capacitance with respect to the ion or charge collector, through which the test signal can be fed into the charge collector.

For a full understanding of the present invention, reference should now be made to the following detailed description of the preferred embodiments of the invention and to the accompanying drawings.

DETAILED DESCRIPTION OF PREFERRED EMBODIMENTS

Figure 1:
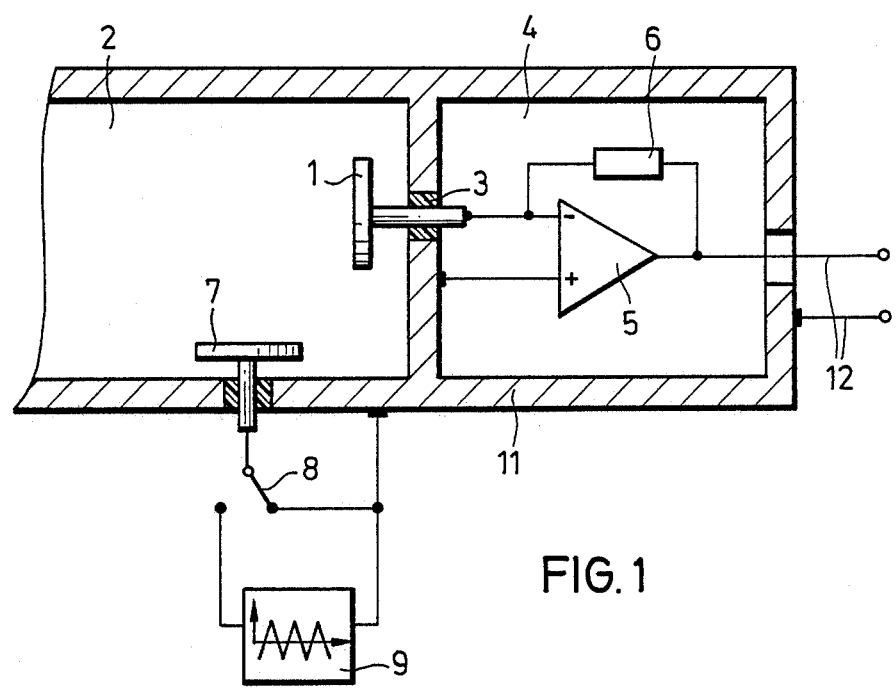
FIG. 1 is a schematic and representational diagram of a measuring system including apparatus for checking the signal path according to one preferred embodiment of the present invention.

The preferred embodiments of the present invention will now be described with reference to FIGS. 1-5 of the drawings. Identical elements in the various figures are designated with the same reference numerals.

The measuring system according to FIG. 1 has a charge collector 1 in a vacuum chamber 2. It is installed, for example, in a mass spectrometer or an ionization vacuum meter, and serves to collect the ions produced. In secondary emission electron multipliers, the amplified current on the collector is an electron current. The charged particles striking the charge collector 1 produce a current which is passed through a feed-through insulator 3 into a chamber 4. This chamber 4 contains an electrometer amplifier 5 with its high resistance 6 that converts the current supplied by the collector 1 into a voltage signal. Conversion to a current signal or to a frequency corresponding to the particle current is often also possible at this point.

An influencing electrode 7 is associated with the charge collector 1 at an appropriate distance away within the vacuum chamber 2. Its size and its arrangement with respect to the collector 1 are best chosen such that it has a capacitance $C_k$ with respect to the collector in the picofarad range. The influencing electrode can be selectively connected by means of a switch 8 either to a signal generator 9 (test period) or to ground (measuring period). The housing 11, in which the chamber with the highly sensitive electronic components 5 and 6 are situated, consists of shielding material, so that the amplifier is shielded against interference from external fields. Such shielding is desirable also in the area of the collector 1 and the influencing electrode 7.

In the embodiment according to FIG. 1, the influencing electrode 7 is grounded during the measuring operation, so that it does not interfere with the measurement.

Figure 2:
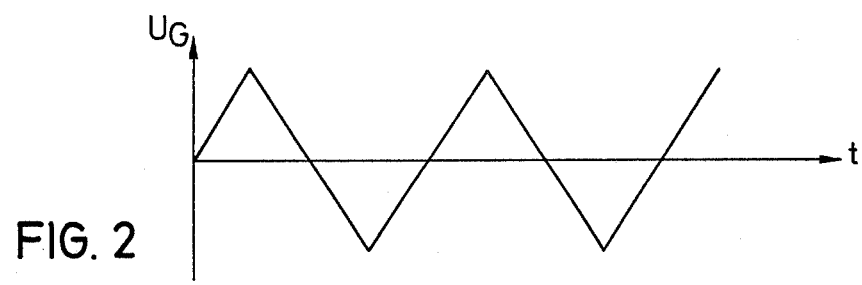
FIG. 2 is a diagram showing the signal waveform of a voltage of $U_G$ generated in the apparatus of FIG. 1.

In order to check the measurement signal path following the charge collector 1, especially in the area of the highly sensitive components, the influencing electrode 7 is connected to the signal generator 9. This generator produces a triangular voltage $U_G$ at this electrode 7 as is shown in FIG. 2. Typically this triangular voltage may have a slow rate of less than 1 V/sec and a frequency of about 0.2 Hz. During each phase of constant rise the triangular voltage produces a constant capacitive current in the collector 1 and thus a defined voltage change at the output of the amplifier.

Figure 3:
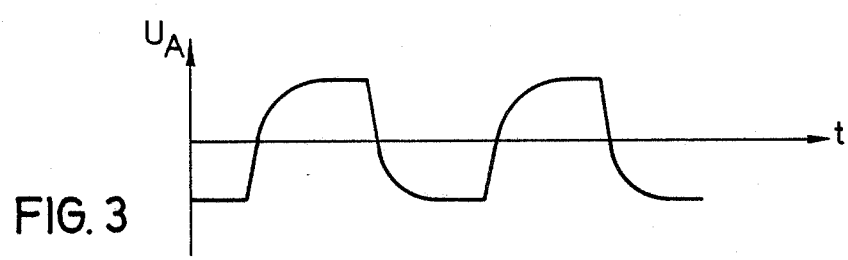
FIG. 3 is a diagram showing the signal waveform of a voltage $U_A$ generated in the apparatus of FIG. 1.

In the ideal case, the output voltage $U_A$ appears as a square wave. Actually, the peak amplitudes of the square-wave signal have rounded edges characterized by smoothly continuous, transitional functions. A typical curve of the output voltage $U_A$ for a given generator voltage $U_G$ (FIG. 2) is shown in FIG. 3.

The peak values of the output voltage are found to be $$U_A = C_K(dU_G(t)/dt)$$

in which $C_K$ is the coupling capacitance between the influencing electrode 7 and the collector 1. $C_K$ is known and reproducible, and with a known voltage from the signal (generator 9) it can produce precisely predetermined signals at the system output in the embodiment according to FIG. 1. In the case of a triangular voltage signal according to FIG. 2 at the influencing electrode 7, there will be a square-wave output voltage at the output 12 (FIG. 3). The difference between the positive and negative peak values of this output signal can be used as a reference for controlling the function or for measuring the sensitivity of the circuit following the collector 1.

This test method is applicable in all amplifiers which amplify bipolar signals—i.e., alternating current signals—at least in their first stage, since the average level of the test signal at the output of the amplifier must always be equal to zero.

Figure 4:
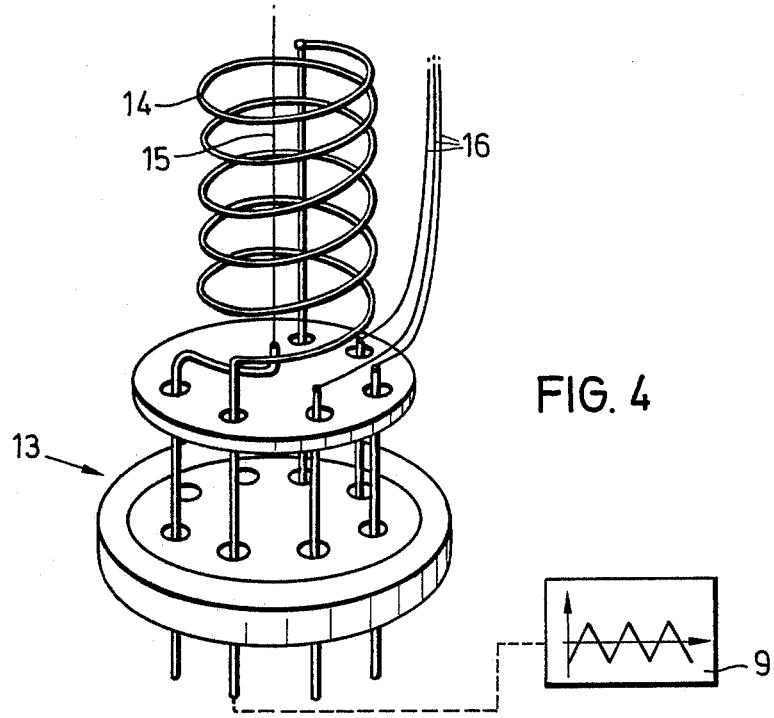
FIG. 4 is a perspective view of an ionization vacuum meter gauge head including electrodes for checking the signal path according to another preferred embodiment of the present invention.

FIG. 4 shows a typical configuration of an ionization vacuum meter gauge tube 13. It includes a spiral anode 14 which surrounds the ion collector 15. A cathode 16 is disposed adjacent the anode 14.

The signal path following the ion collector can be tested in gauge tubes of this kind by using the anode 14 as the influencing electrode during the testing operation. If a triangular voltage of the type shown in FIG. 2 is applied to the anode 14, the desired capacitive current is fed into the ion collector 15. Testing of the operation of the following electronic components is performed in the manner already described.

Figure 5:
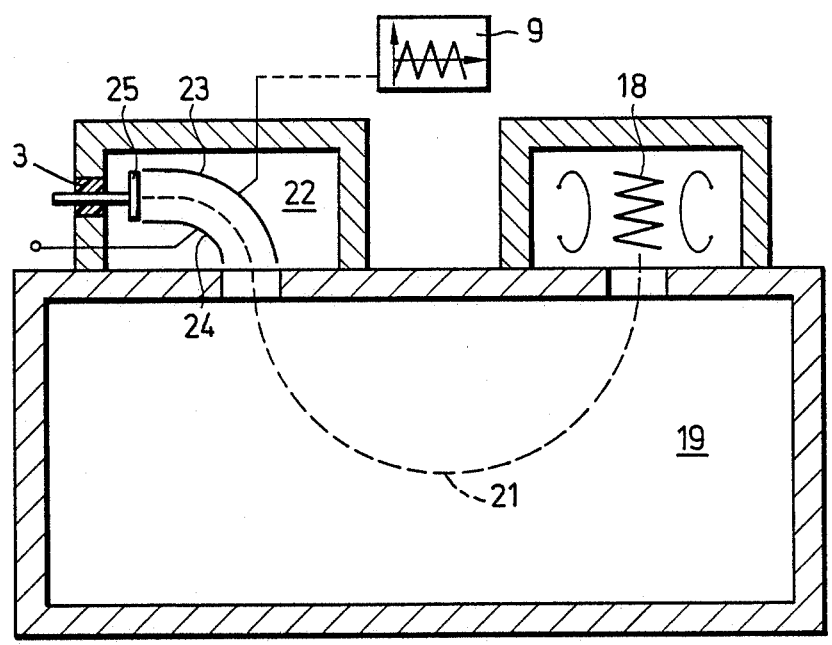
FIG. 5 is a schematic and representational diagram of a mass spectrometer having an electrode for the test signal according to still another preferred embodiment of the present invention.

FIG. 5 shows a mass spectrometer 17 of the kind often used in helium-type leak detectors. The ion source of the mass spectrometer is identified as 18. The gas to be tested is fed to the source 18 in a manner not otherwise indicated. Within the chamber 19 there is a field for the deflection of ions, which is permanently adjusted to the mass of the test gas, such as helium. Only the ions of this mass travel along the path 21, indicated in dashed lines, into the chamber 22 where the deflection electrodes 23 and 24 are situated. By means of these deflection electrodes, the ions are directed against the ion collector 25. The current produced is again supplied through a feed-through insulator 3 to an amplifier 5 of the type shown in FIG. 1.

In the mass spectrometer according to FIG. 5, it is possible to use either one of the two deflection electrodes 23 and 24 as the influencing electrode. An electrode of a separating system (e.g., one of the poles of a quadruple mass spectrometer) situated in front of the ion collector could also serve as a influencing electrode. During the test operation, the electrode in question is connected to a signal generator 9 and the signal path is checked in the manner already described.

In the embodiments described in FIGS. 4 and 5, the possibility exists of testing the signal path while the ionization vacuum guage or the mass spectrometer is turned on. During the measuring operation, a DC voltage is applied to the same electrodes 14 or 23, which are used during the test operation as the influencing electrodes. The triangular AC signal from the generator 9 can be superimposed on this DC voltage, so that the desired capacitive current is introduced into the ion collector 15 or 25. For reliable testing of the following electronic circuitry by this method, it is necessary that relatively stable pressure conditions exist during the testing operation.

An especially advantageous method of testing consists in raising the nominal DC— voltage applied to the electrodes 14 or 23, that serve as influencing electrodes, in a gradual manner, instead of turning it on in an uncontrolled manner as is usually done. In this case, only one ramp instead of the many rising and falling triangles, which are otherwise produced by the generator 9, is applied to the influencing electrode. The capacitive current fed into the ion collectors 14 and 25 as a result of this single, defined rising ramp of the applied voltage can be used to check the signal path without additional effort, and can be utilized at a time at which the measurement will not be influenced.

The invention makes it possible to test the sensitivity of electrometer amplifiers in the installed condition (e.g., during standby operation), and also to calibrate them under certain circumstances. Especially in the case of the highly sensitive mass spectrometers for helium-type leakage detectors, this possibility of checking the signal path is important.

The described check can also be a self-check if appropriate control means are provided. The test method described, in which the operating voltages which have to be turned on anyway are ramped up in a controlled manner and introduce a defined capacitive current in the ion collector, is thus especially suitable for self-checking.

It will be understood that the specification and examples are illustrative but not limitative of the present invention in that other embodiments within the spirit and scope of the present invention as defined in the following claims will suggest themselves to those skilled in the art.

What is claimed is:

1. A method for checking the signal path in a measuring system having a collector for charged particles and an amplifier, said amplifier being electrically connected to said collector and producing an output signal representative of the rate at which charged particles impinge on said collector, said method comprising the steps of:

producing a triangular voltage signal;

applying said voltage signal to an influencing electrode situated in the vicinity of said collector, wherein said voltage signal produces a defined change in said output signal; and determining the difference between the positive and negative peak values of said output signal as a result of the application of said triangular voltage signal to evaluate the sensitivity of said measuring system.

2. The method defining claim 1, wherein a working electrode, already present in said measuring system, is used as said influencing electrode.

3. The method defined in claim 2, wherein said step of producing a triangular voltage signal includes the step of ramping up or down a DC working voltage which is applied to said working electrode during a normal measuring operation of said measuring system.

4. The method defining claim 1, wherein said measuring system is a mass spectrometer having at least one particle deflecting electrode preceding said charge collector, and wherein said deflecting electrode is used as said influencing electrode in said method.

5. The method defining claim 1, wherein said measuring system is an ionization vacuum meter having at least one anode, and wherein said anode is used as said influencing electrode in said method.

6. An apparatus for checking the signal path in a measuring system comprising, in combination;

a collector means for collecting charged particles;

amplifier means, electrically connected to said collector means, for producing an output signal representative of the rate at which charged particles impinge on said collector means;

an influencing electrode disposed in the vicinity of said collector means;

means for producing a triangular voltage signal;

means for applying said voltage signal to said influencing electrode, wherein said voltage signal produces a defined change in said output signal; and means for determining the difference between the positive and negative peak values of said output signal as a result of the application of said voltage signal to evaluate the sensitivity of said measuring system.

7. The apparatus defined in claim 6, wherein said influencing electrode is a separate electrode, associated with said collector means, which is grounded during the normal measuring operation of said measuring system.

8. The apparatus defined in claim 6, wherein said measuring system is a mass spectrometer having at least one particle deflecting electrode preceding said collector means, and wherein said deflecting electrode is used as said influencing electrode.

9. The apparatus defined in claim 6, wherein said measuring system is a mass spectrometer having at least one particle deflecting electrode preceding said collector means, and wherein said influencing electrode is a separate electrode, associated with said collector means.

10. The apparatus defined in claim 6, wherein said measuring system is an ionization vacuum meter having a cathode, an anode and an ion collector, and wherein said anode is used as said influencing electrode.

11. The apparatus defined in claim 6, wherein said measuring system is an ionization vacuum meter having a cathode, an anode and an ion collector, and wherein said influencing electrode is a separate electrode, associated with said collector means.

* * * * *